Feb. 23, 1971 R. W. COPE 3,566,289

CURRENT AMPLIFIER AND INVERTING CIRCUITS

Filed March 17, 1969

INVENTOR.
ROBERT W. COPE

BY

William G. Christoforo
ATTORNEY

United States Patent Office 3,566,289
Patented Feb. 23, 1971

3,566,289

CURRENT AMPLIFIER AND INVERTING CIRCUITS

Robert W. Cope, Sparks, Md., assignor to The Bendix Corporation, a corporation of Delaware Filed Mar. 17, 1969, Ser. No. 807,752
Int. Cl. H03f 3/42
U.S. Cl. 330—19 14 Claims

ABSTRACT OF THE DISCLOSURE

Current amplifier and current inverting circuits are described which are comprised of semi-conductor elements and which operate in the current domain.

BACKGROUND OF THE INVENTION

This invention relates to current amplifier and current inverting circuits and more particularly to such circuits which operate in the current domain and are comprised of forward biased semiconductor elements.

Until recently, semi-conductor means for inverting current had been virtually unknown and the other known means for current amplification was through use of the transistor beta mechanism. As is well known, the transistor beta mechanism has the disadvantage of being nonlinear over its dynamic range and sensitive to temperature as well as being inconsistent from transistor to transistor. In general, the other typically used means for amplifying or inverting current employ techniques wherein current is converted to voltage by passing the current to be processed through a resistor, amplifying or inverting the voltage obtained, and converting the new voltage to current by impressing this voltage across a second resistor and sensing the resulting current flowing therethrough. Even though it was known that semi-conductor devices operating in the current domain had a dynamic response several orders of magnitude greater than a similar device operating in the voltage domain, there was little, if any, work done to develop such current domain operative circuits due to the ready availability of resistive elements and their easy utility in discrete semi-conductor circuits. The development of integrated circuits technology and the difficulty experienced in manufacturing reliable resistive elements incorporated into integrated circuits sparked new interest in current domain operative amplifiers, that is amplifiers which require no resistive elements. The presently known current operative circuits utilize a transistor in one circuit arm and a diode in a second circuit arm. The transistor base electrode and the diode cathode electrode are connected and the current to be amplified is injected into one circuit arm. Semi-conductor means are provided responsive to the injected current for developing on the common connection a forward bias which causes a current related to the injected current to flow in the other arm. However, since it is impossible to match a transistor and a diode both with respect to temperature and dynamic range, inaccuracies and performance uncertainties are introduced when temperature or the circuit operating point is varied.

Accordingly, it is an object of this invention to provide current amplifying and inverting circuits which are comprised of forward bias transistors.

Another object of this invention is to provide current amplifying and inverting circuits which are simply constructed and simple in their operation.

It is another object of this invention to provide current amplifying and inverting circuits which are essentially temperature stabilized.

One further object of this invention is to provide circuits of the type described which can be implemented in integrated circuitry form.

Still one more object of this invention is to provide current amplifying and inverting circuits which are more accurate than prior art circuits of this type.

These and other objects of this invention will become apparent to one skilled in the art with a reading and understanding of the following description of the invention and claims.

SUMMARY OF THE INVENTION

The invention as herein described and shown in the drawings comprises amplifiers and current inverters operating in the current domain and whose active elements are forward biased transistors. The simplest current inverter circuit shown uses first and second matched, like polarity transistors having base electrodes connected to one another and a third transistor which is responsive to current through the first transistor for maintaining proper base current drive at the common base connection. Current injected into the collector-emitter circuit of the first transistor develops a forward bias across the base emitter junction thereof, which is similarly impressed across the base emitter junction of the second transistor thus causing current to flow through the collector-emitter circuit of the second transistor. Simply and briefly stated, the principle of operation of this circuit is to develop a base drive at a first transistor due to current injected through the transistor and to transfer this base drive to a second, identical, transistor (identically connected) to develop an identical current therethrough.

The simplest current amplifier circuit shown herein makes use of the aforementioned principle with the exception that the bias voltages impressed on the base-emitter junctions of the first and second transistors differ. Briefly, current is injected into the emitter of the first transistor which results in a voltage across the base-emitter junction thereof which is transferred across the base-emitter junction of a second transistor which in addition also has an external bias voltage impressed thereon. Thus, a total voltage is impressed across the second transistor base-emitter junction which is related to the sum of the first transistor base-emitter junction voltage and the external bias voltage. The current in the second transistor is equal to the injected current times an amplification factor which is related to the external bias voltage. Thus, current amplification is readily adjusted merely by changing the bias voltage level.

More complex current amplifiers and inverting circuits are shown which basically are comprised of the simplified current inverting and amplifying circuits, the only difference in the operation of the circuits coming about from the manner in which bias voltages are applied thereto.

DESCRIPTION OF THE PREFERRED EMBODIMENT

Figures 1, 2, 3, 4:
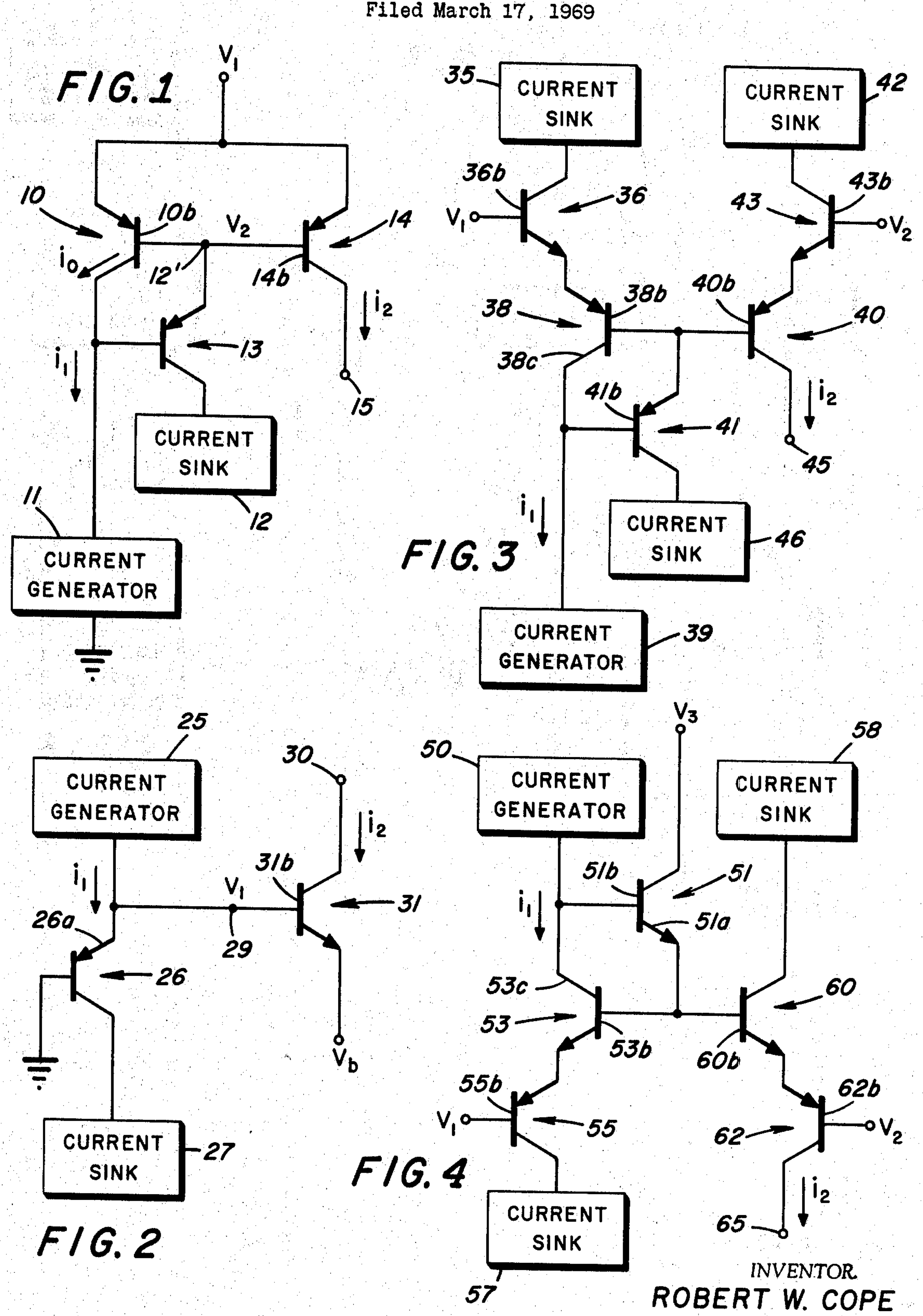
FIG. 1 is a schematic of a simple current inverting circuit employing the principles of my invention.
FIG. 2 is a schematic of a simple current amplifier circuit employing the principles of my invention.
FIG. 3 is a schematic of a more complex circuit which may be operated as either a current amplifier or a current inverter.
FIG. 4 is a schematic of a circuit similar to the circuit shown in FIG. 3 except using transistors of opposite polarity than those shown in FIG. 3.

Referring to FIG. 1, a transistor 10, having its emitter-collector connected across current generator 11 and a source (not shown) of bias voltage $V_1$, has its base electrode **10*b* connected directly to base electrode 14*b* of transistor 14, which has its emitter-collector circuit connected between output terminal 15 and the bias voltage source. A feedback transistor 13 has its emitter-collector circuit connected between the base electrode common terminal and current sink 12 and its base electrode connected to the collector electrode of transistor 10. Bias voltage $V_1$ establishes the operating voltage level of the emitters of transistors 10 and 14, its actual value being unimportant to the operation of the circuit as will be readily understood from the following description, especially the description of the mathematical model. Current $i_1$, which is the sum of transistor 10 collector current and transistor 13 base current, is controlled by current generator 11, thus regulating the forward bias voltage across the emitter-base junction of transistor 10, which in turn controls the voltage at common base terminal 12'. Since both the emitter of transistor 14 as well as the emitter of transistor 10 are connected to the same bias voltage, the emitter-base junction voltage at transistor 14 is identical to the emitter-base voltage at transistor 10. Thus transistor 14 collector current, $i_2$ is identical to current $i_1$ except for the base current added thereto from transistor 13. Transistor 13 base current is negligible with respect to the magnitude of current $i_1$ as can be seen the fact that transistor 10 base current differs from transistor 10 collector current by a factor $\beta^{-1}$ while tansistor 13 base current differs from transistor 13 collector current also by a factor of $\beta^{-1}$, where transistor 13 emitter current is equal to the sum of transistors 10 and 14 base currents. Thus, transistor 13 base current will differ from current $i_1$ by a factor approximately equal to $\beta^{-2}$. Since the betas of modern transistors are quite high, being in the order of 100, it can be seen that transistor 13 base current is quite small, i.e., in the order of $10^{-4}$ times smaller than current $i_0$, transistor 10** collector current.

In the mathematical analyses to follow the exponential factor $n$ is constant for a particular semiconductor and involves physical processes in the junction region of the semiconductor.

The circuit of FIG. 1 can be analyzed mathematically as follows:

where:

$i_0$=transistor 10 collector current
$i_{s1}$=transistor 10 reverse saturation current
$i_{s2}$=transistor 14 reverse saturation current
$V_2$=voltage developed at terminal 12
$n_1$ is associated with transistor 10
$n_2$ is associated with transistor 14

$$i_0=i_{s1}\exp\left[\frac{q(V_1-V_2)}{n_1KT}\right] \quad (1)$$

$$V_2=V_1-\frac{n_1KT}{q}\ln\frac{i_0}{i_{s1}} \quad (2)$$

$$i_2=i_{s2}\exp\left[\frac{q(V_1-V_2)}{n_2KT}\right] \quad (3)$$

substituting (2) into (3)

$$i_2=i_{s2}\left(\frac{i_0}{i_{s1}}\right)^{n_1/n_2} \quad (4)$$

If transistors 10 and 14 are matched so that $$n_1=n_2$$

and $$i_{s1}=i_{s2}$$

then:

$$i_2=i_0$$

and $i_2=i_1$ except for transistor 13 negligible base current.

Referring now to FIG. 2, transistor 26 has its emitter-collector circuit connected between current generator 25 and current sink 27 and its base electrode connected to ground. Transistor 31 has its collector-emitter circuit connected between output terminal 30 and a source of bias voltage $V_b$. Emitter electrode 26*a* is directly connected to base electrode 31*b* at common terminal 29. The operation of this circuit is explained as follows. Current $i_1$ is injected from current generator 25 into emitter electrode 26*a,* thus producing a resultant emitter voltage $V_1$ which is transferred through common terminal 29 to the base electrode of transistor 31. Bias voltage $V_b$, which may be adjusted to vary the amplification factor of the circuit as will be seen in the mathematical model thereof, applied to the emitter electrode of transistor 31 together with voltage $V_1$ cause a current to flow in the emitter circuit of transistor 31. All of this latter current, with the exception of the negligible portion which flows in the base of transistor 31, flows in the collector of transistor 31 and is designated $i_2$. Current $i_2$ flows through terminal 30 and comprises the amplified current output of the circuit.

The following is a mathematical model of the circuit of FIG. 2 wherein:

$s_1$=transistor 26 reverse saturation current
$s_2$=transistor 31 reverse saturation current
$n_1$ is associated with transistor 26
$n_2$ is associated with transistor 31.

$$i_2=i_{s2}\exp\frac{q(V_1+V_b)}{n_2KT} \quad (5)$$

$$i_1=i_{s1}\exp\frac{qV_1}{n_1KT} \quad (6)$$

$$V_1=\frac{n_1KT}{q}\ln\frac{i_1}{i_{s1}} \quad (7)$$

substituting (7) into (5) and simplifying:

$$i_2=i_{s2}\left(\frac{i_1}{i_{s1}}\right)^{n_1/n_2}\exp\frac{qV_b}{n_2KT} \quad (8)$$

If the transistors are selected so that $n_1=n_2$ $$i_2=i_1\left(\frac{i_{s2}}{i_{s1}}\right)\exp\frac{qV_b}{n^2KT} \quad (9)$$

It thus becomes clear that $V_b$ is a variable parameter from which current gain depends.

The problem with a circuit such as that shown in FIG. 2 is that it is virtually impossible to match both the $n$-factors and the $i_s$-factors in transistors of opposite polarity. It is of primary importance to match the $n$-factors so that the circuit transfer function from input to output will be linear. The mismatch in $i_s$-factors of the unlike transistors, however, cause temperature problems since it is unlikely that the transistors will temperature-track and the change in the $i_s$-factor with temperature change is considerable, being in the order of doubling every 10° C.

The circuit of FIG. 3, which may be operated either as a current inverter or a current amplifier, as will be explained, provides substantial temperature compensation and reference should now be made to this figure. A transistor 36, having a base electrode 36*b* connected to a source (not shown) of bias voltage $V_1$, has its collector-emitter circuit connected serially with the emitter-collector circuit of transistor 38 between current sink 35 and current generator 39. A third transistor 43 having its base electrode 43*b* connected to a source (not shown) of bias voltage $V_2$, has its collector-emitter circuit connected serially with the emitter collector circuit of a fourth transistor 40 between current sink 42 and output terminal 45. Base terminals 38*b* and 40*b* of transistors 38 and 40 respectively are connected together and to the emitter electrode of a fifth transistor 41, whose base electrode 41*b* is connected to collector electrode 38*c* and whose collector electrode is connected to current sink 46. It will be noted that the emitter-base junctions of transistors 36, 38 and 41 are serially connected between bias voltage source $V_1$ and current generator 39, while in like manner the base-emitter junctions of transistors 43, 40 and 41 are similarly connected between bias voltage source $V_2$ and current generator 39.

Thus, base current drive is provided for all transistors while current generator 39 regulates the magnitude of collector 38*c* current $i_{1'}$ assuming that the various base currents are negligible with respect thereto. The voltage between base electrodes 36*b* and 38*b* is determined by the magnitude of current $i_1$, hence determining the voltage at base electrode 38*b*. The voltage between base electrodes 43*b* and 40*b* is thus related to current $i_1$, and if bias voltage $V_2$ is identical to bias voltage $V_1$, voltage across base electrodes 43*b* and 40*b* is identical to the voltage across base electrodes 36*b* and 38*b*. In this case, that is, when bias voltage $V_1$ is identical to bias voltage $V_2$, the circuit illustrated operates as a current inverter with current $i_2$ being identical to current $i_1$, again assuming base 41*b* current is negligible with respect to current $i_1$. The reasoning to show this is identical to the reasoning used in connection with the description of FIG. 1, which lead to the conclusion that base current of transistor 13 was generally less than current $i_1$ by a factor approximately equal $\beta^{-2}$.

If bias voltages $V_1$ and $V_2$ differ, the voltage across base electrodes 36*b* and 38*b* differs from the voltage across base edectrodes 43*b* and 40*b*. However, the common voltage at base electrodes 38*b* and 40*b* is still determined by current $i_1$ and is related to bias voltage $V_1$. In this latter case, the circuit will operate as an amplifier with current $i_2$ being amplified over current $i_1$ by an amplification factor dependent upon the difference of the bias voltages $V_1$ and $V_2$.

The mathematical model for the circuit of FIG. 3 is developed as follows:

Assuming negligible base current and $V_a$=voltage across base terminals 36*b* and 38*b*
$V_b$=voltage across base terminals 43*b* and 40*b*
$i_{s1}$ and $n_1$—are associated with transistor 36
$i_{s2}$ and $n_2$—are associated with transistor 38
$i_{s3}$ and $n_3$—are associated with transistor 43
$i_{s4}$ and $n_4$—are associated with transistor 40

$$i_2=(i_{s3}^{n_3} i_{s4}^{n_4})^{\frac{1}{n_3+n_4}} \exp \frac{qV_b}{(n_3+n_4)KT} \quad (10)$$

$$i_1=(i_{s1}^{n_1} i_{s2}^{n_2})^{\frac{1}{n_1+n_2}} \exp \frac{qV_a}{(n_1+n_2)KT} \quad (11)$$

thus:

$$V_a=\frac{KT}{q}\left[\ln\left(\frac{i_1}{s_1}\right)^{n_1}+\ln\left(\frac{i_1}{i_{s2}}\right)^{n_2}\right] \quad (12)$$

But:

$$V_1-V_2=V_3=V_a-V_b$$

so that:

$$V_b-V_a-V_3 \quad (13)$$

and substituting (12) and (13) into (10) and if transistors are selected so that $n_1=n_2=n_3=n_4=n$ and like polarity transistors are matched so that $$i_{s1}=i_{s3}$$
$$i_{s2}=i_{s4}$$

then:

$$i_2=i_1 \exp \frac{qV_3}{2nKT} \quad (14)$$

Remembering that:

$$V_1-V_2=V_3$$

it can be seen that where:

$$V_1=V_2$$

then:

$$i_1=i_2$$

that is, where the bias voltages are equal, the circuit operates as a current inverter. Where the bias voltages are unequal, the circuit operates as a current amplifier with the amplification factor equal to:

$$\exp \frac{q^{V_3}}{2_n KT}$$

Since Equation 14 contains no reverse saturation current term, which terms cause major temperature instability, the circuit is basically temperature stable except for the temperature term in the amplification factor. Since the temperature variance in the amplification factor is quite predictable it can be easily compensated by the use of a resistor or other similar means. As has been mentioned earlier, the amplification factor is related to the difference in bias voltages.

Referring now to FIG. 4 which illustrates a circuit similar to the circuit in FIG. 3 except having transistors of opposite polarity, transistors 53 and 55 are seen to have their collector-emitter circuits serially connected between current generator 50 and current sink 57. Base electrode 55*b* is connected to a source of bias voltage $V_1$. Similarly, transistors 60 and 62 have their collector-emitter circuits connected between current sink 58 and output terminal 65. Base electrode 62*b* is connected to a source of bias voltage $V_2$. Base electrodes 53*b* and 60*b* are connected to one another and to emitter electrode 51*a*. Base electrode 51*b* is connected to collector electrode 53*c* while the collector of transistor 51 is connected to a source of bias voltage $V_3$ which comprises a third current sink. Bias voltage $V_1$ provides the base drive for transistors 51, 53 and 55 through their base-emitter junctions, which are connected in series between the aforementioned current generator 50 and bias $V_1$. As in FIG. 3, current generator 50 regulates transistor 53 collector current $i_1$ Current $i_1$ in turn regulates the voltage across base electrodes 53*b* and 55*b* and hence also controls the voltage at the common junction of base electrodes 53*b* and 60*b*. It should now be obvious from the previous discussion and the development of the mathematical model with respect to FIG. 3, that should bias voltage $V_1$ be equal to bias voltage $V_2$ the circuit of FIG. 4 will operate as a current amplifier of unity gain with output current $i_2$ equal to injected current $i_1$ the drive voltage across transistors 53 and 55 being equal to the drive voltage across transistors 60 and 62. On the other hand, if terminal 65 were connected to a current sink and current sink 58 were removed, the terminal to which it is connected would produce an output current equal in magnitude to $i_1$ but inverted. Where the bias voltage $V_1$ is not equal to bias voltage $V_2$ the circuit will operate as a current amplifier with the amplification factor related to the difference in bias voltages.

The invention claimed is:

1. A current inverter comprising:
a power terminal;
a source of D.C. voltage connected to said power terminal;
a current input terminal;
a current output terminal;
a first transistor having base, collector and emitter electrodes, said emitter electrode being connected to said power terminal and said collector electrode being connected to said input terminal;
a second transistor having base, collector and emitter electrodes, said last named base electrode being connected in common to said first transistor base electrode, said last named collector electrode being connected to said current output terminal, and said last named emitter electrode being connected to said power terminal;
means for injecting input current into said input current terminal; and
means responsive to said input current for regulating the base current of said first and second transistors.

2. A current inverter as recited in claim 1 wherein said means for regulating the base current of said first and second transistors comprises:

a current sink; and, a third transistor having a base electrode and an emitter-collector circuit, said latter base electrode being connected to said input terminal and said latter emitter-collector circuit being connected between said common base connection and said current sink.

3. A current invrteer as recited in claim 2 wherein said first and second transistors are similarly poled.

4. A current inverter as recited in claim 3 wherein said first and second transistors are preselected to be matched to one another.

5. A current inverter as recited in claim 4 wherein said third transistor is similarly poled as said first and second transistor, said third transistor emitter electrode being connected to said common base connection and said third transistor collector electrode being connected to said current sink.

6. Means responsive to current flowing between a current sink and a current generator for generating an amplified current flowing into an output terminal comprising:

a first transistor having base, collector and emitter electrodes, the collector-emitter circuit being connected between said first current sink and said current generator;

a first constant voltage source connected to said base electrode;

a second constant voltage source; and a second transistor having base, collector and emitter electrodes, said second transistor collector-emitter circuit being connected between said second constant voltage source and said output terminal and said last named base electrode being connected to said first named emitter electrode.

7. Means responsive to first current flowing between a first current sink and a current generator for generating an amplified current flowing from a second current sink to an output terminal comprising:

a first transistor having base, emitter and collector electrodes;

a second transistor having base, emitter and collector electrodes, said first and second transistor emitter—collector circuits being serially connected and emitter to emitter between said first current sink and said current generator;

a third transistor having base, emitter and collector electrodes;

a fourth transistor having base, emitter and collector electrodes, the emitter-collector circuit of said fourth transistor being serially connected and emitted to emitter with the emitter-collector circuit of said third transistor between said second current sink and said output terminal, said fourth transistor base electrode being connected to said second transistor base electrode;

a source of first D.C. bias voltage connected to said first transistor base electrode;

a source of second D.C. bias voltage connected to said third transistor base electrode; and means responsive to said first current for regulating the base current of said second and fourth transistors.

8. Means as recited in claim 7 wherein said means for regulating the base current of said second and fourth transistors comprises a third current sink and a fifth transistor having base, emitter and collector electrodes, said latter base electrode being connected to said second transistor collector electrode and said latter emitter-collector circuit being connected between the junction of said second and fourth transistor base electrodes and said third current sink.

9. Means as recited in claim 8 wherein said first D.C. bias voltage is equal to said second D.C. bias voltage.

10. Means as recited in claim 8 wherein said first and third transistors are similarly poled to one another but oppositely poled from said second and fourth transistors.

11. Means as recited in claim 10 wherein said first, second, third and fourth transsitors are matched to have essentially identical n-factors.

12. Means as recited in claim 10 wherein said first and third transistors are preselected to have essentially identical reverse saturation currents and said second and fourth transistors are preselected to have essentially identical reverse saturation currents.

13. Means as recited in claim 12 wherein said first, second, third and fourth transistors are preselected to have essentially identical n-factors.

14. Means as recited in claim 13 wherein said first D.C. bias voltage is equal to said second D.C. bias voltage.

References Cited

UNITED STATES PATENTS 3,262,064 7/1966 Hilbiber ----------- 330—30X

ROY LAKE, Primary Examiner

L. J. DAHL, Assistant Examiner

U.S. Cl. X.R.

330—30